United States Patent
Cardineau et al.

(10) Patent No.: US 12,360,454 B2
(45) Date of Patent: Jul. 15, 2025

(54) STABILIZED INTERFACES OF INORGANIC RADIATION PATTERNING COMPOSITIONS ON SUBSTRATES

(71) Applicant: Inpria Corporation, Corvallis, OR (US)

(72) Inventors: Brian J. Cardineau, Corvallis, OR (US); Shu-Hao Chang, Leuven (BE); Jason K. Stowers, Corvallis, OR (US); Michael Kocsis, Albany, OR (US); Peter de Schepper, Wijnegem (BE)

(73) Assignee: Inpria Corporation, Corvallis, OR (US)

( * ) Notice: Subject to any disclaimer, the term of this patent is extended or adjusted under 35 U.S.C. 154(b) by 647 days.

(21) Appl. No.: 16/926,125

(22) Filed: Jul. 10, 2020

(65) Prior Publication Data

US 2021/0011383 A1  Jan. 14, 2021

Related U.S. Application Data

(60) Provisional application No. 62/873,489, filed on Jul. 12, 2019.

(51) Int. Cl.
| | | |
|---|---|---|
| *G03F 7/11* | (2006.01) | |
| *G03F 7/004* | (2006.01) | |
| *G03F 7/16* | (2006.01) | |
| *G03F 7/20* | (2006.01) | |
| *G03F 7/32* | (2006.01) | |

(52) U.S. Cl.
CPC .............. *G03F 7/11* (2013.01); *G03F 7/0042* (2013.01); *G03F 7/167* (2013.01); *G03F 7/168* (2013.01); *G03F 7/2004* (2013.01); *G03F 7/2037* (2013.01); *G03F 7/322* (2013.01)

(58) Field of Classification Search
CPC .......... G03F 7/095; G03F 7/11; G03F 7/0043; G03F 7/0042; G03F 7/0044
See application file for complete search history.

(56) References Cited

U.S. PATENT DOCUMENTS

| 5,322,765 | A | * | 6/1994 | Clecak | ................... G03F 7/038 430/326 |
|---|---|---|---|---|---|
| 6,809,127 | B2 | | 10/2004 | Dones et al. | |
| 7,361,444 | B1 | | 4/2008 | Angelopoulos et al. | |
| 8,207,264 | B2 | | 6/2012 | Belcheva et al. | |
| 9,176,377 | B2 | | 11/2015 | Stowers et al. | |
| 9,195,137 | B2 | | 11/2015 | Endo et al. | |
| 9,310,684 | B2 | | 4/2016 | Meyers et al. | |
| 9,372,402 | B2 | | 6/2016 | Freedman et al. | |
| 9,527,971 | B2 | | 12/2016 | Oner-Deliornmanli | |
| 9,929,012 | B1 | | 3/2018 | Belyansky et al. | |
| 9,996,004 | B2 | | 6/2018 | Smith et al. | |
| 10,078,265 | B2 | | 9/2018 | Aoki et al. | |
| 10,228,618 | B2 | | 3/2019 | Meyers et al. | |
| 10,627,719 | B2 | | 4/2020 | Waller et al. | |
| 10,642,153 | B2 | | 5/2020 | Meyers et al. | |
| 2002/0076495 | A1 | | 6/2002 | Maloney et al. | |
| 2004/0265754 | A1 | * | 12/2004 | Barclay | ................. G03F 7/0758 430/14 |
| 2005/0279995 | A1 | | 12/2005 | Shin et al. | |
| 2006/0293482 | A1 | | 12/2006 | Rantala et al. | |
| 2007/0082288 | A1 | | 4/2007 | Wright et al. | |
| 2008/0124649 | A1 | | 5/2008 | Angelopoulos et al. | |
| 2009/0047517 | A1 | | 2/2009 | Caruso et al. | |
| 2009/0258315 | A1 | | 10/2009 | Ober et al. | |
| 2012/0088192 | A1 | | 4/2012 | Trefonas et al. | |
| 2013/0224652 | A1 | | 8/2013 | Bass et al. | |
| 2013/0260313 | A1 | * | 10/2013 | Allen | .................... C08F 228/02 430/326 |
| 2015/0056542 | A1 | * | 2/2015 | Meyers | ................. G03F 7/0043 430/296 |
| 2015/0234272 | A1 | | 8/2015 | Serma et al. | |
| 2016/0011505 | A1 | | 1/2016 | Stowers et al. | |
| 2016/0187777 | A1 | | 6/2016 | Nakagawa et al. | |
| 2017/0088758 | A1 | | 3/2017 | Bzowej et al. | |
| 2017/0309493 | A1 | | 6/2017 | Ogihara et al. | |
| 2018/0203355 | A1 | * | 7/2018 | De Silva | ............... G03F 7/2004 |
| 2018/0233362 | A1 | | 8/2018 | Glode et al. | |
| 2018/0335698 | A1 | | 11/2018 | Nakajima et al. | |

(Continued)

FOREIGN PATENT DOCUMENTS

| JP | 2000-206680 A | 7/2000 |
|---|---|---|
| JP | 2001-022068 A | 1/2001 |

(Continued)

OTHER PUBLICATIONS

Wang et al., "Novel polymeric anionic photoacid generators (PAGS) and corresponding polymers for 193 nm lithography", J. Mater. Chem., 16, 3701-3707, (2006). (Abstract Only).
Xu et al., "Underlayer Designs to Enhance the Performance of EUV Resists", Proc. of SPIE, vol. 7273, pp. 72731J-1-72731J-11 (2009).
International Search Report And Written Opinion For Application No. PCT/US2020/041577 dated Nov. 6, 2020.
Office Action from corresponding Taiwan Patent Application No. 109123314 dated Feb. 9, 2023.
Office Action from corresponding Japanese Patent Application No. 2022-501217 dated Aug. 22, 2023.
Cardineau et al., "Photolithographic Properties of tin-oxo Clusters Using Extreme Ultraviolet Light (13.5nm)", Microelectronic Engineering, 127, Elsevier, p. 44-50, (Apr. 24, 2014).

(Continued)

*Primary Examiner* — Daborah Chacko-Davis
(74) *Attorney, Agent, or Firm* — Christensen, Fonder, Dardi PLLC; Diane E. Bennett; Peter S. Dardi

(57) ABSTRACT

A method is described for stabilizing organometallic coating interfaces through the use of multilayer structures that incorporate an underlayer coating. The underlayer is composed of an organic polymer that has crosslinking and adhesion-promoting functional groups. The underlayer composition may include photoacid generators. Multilayer structures for patterning are described based on organometallic radiation sensitive patterning compositions, such as alkyl tin oxo hydroxo compositions, which are placed over a polymer underlayer.

23 Claims, 6 Drawing Sheets

(56) References Cited

U.S. PATENT DOCUMENTS

| | | |
|---|---|---|
| 2019/0153001 A1 | 10/2019 | Cardineau et al. |
| 2019/0308998 A1 | 10/2019 | Cardineau et al. |
| 2019/0385837 A1* | 12/2019 | Chacko ............ H01L 21/02304 |
| 2020/0124970 A1 | 4/2020 | Kocsis et al. |

FOREIGN PATENT DOCUMENTS

| | | |
|---|---|---|
| JP | 2011-164345 A | 8/2011 |
| WO | 2009-052352 A1 | 4/2009 |
| WO | 2018-179704 A1 | 10/2018 |
| WO | 2019-241402 A1 | 12/2019 |
| WO | 2021-011367 A1 | 1/2021 |

OTHER PUBLICATIONS

Office Action from corresponding Taiwan Patent Application No. 109123314 dated Jul. 12, 2023.

Search Report from corresponding European Patent Application No. 20840825 dated Jun. 21, 2023.

* cited by examiner

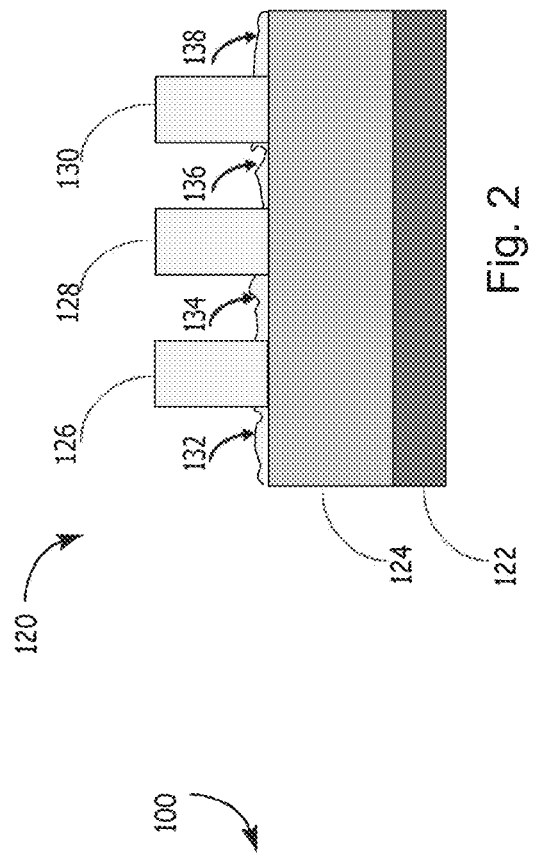
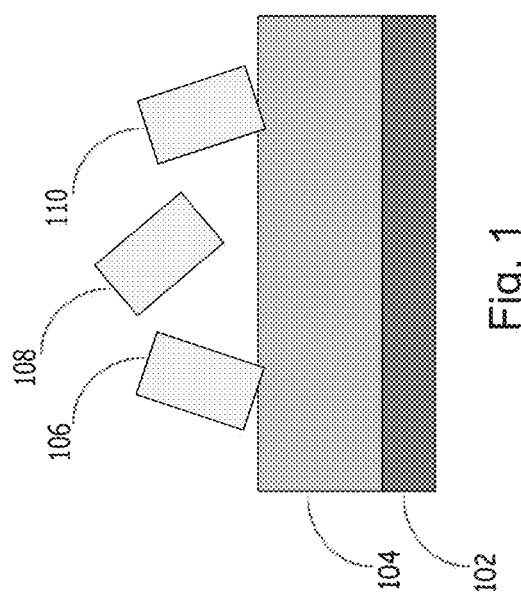

STABILIZED INTERFACES OF INORGANIC RADIATION PATTERNING COMPOSITIONS ON SUBSTRATES

CROSS REFERENCE TO RELATED APPLICATIONS

This application claims priority to U.S. patent application 62/873,489 to Cardineau et al. filed on Jul. 12, 2019, entitled "Stabilized Interfaces of Inorganic Radiation Patterning Compositions on Substrates," incorporated herein by reference.

FIELD OF THE INVENTION

The invention relates to the use of multilayer structures that incorporate a stabilizing layer in contact with an organometallic coating layer to enable the coating to be patterned with very high resolution with radiation.

BACKGROUND OF THE INVENTION

Successful fabrication of semiconductor devices requires multiple iterative steps of lithographic patterning, e.g. deposition, photopatterning, and etching. As the iterative process progresses, any defects or errors in processing in initial steps can negatively affect the results of subsequent steps, including the performance of fully processed circuits. As it is very difficult to correct or repair defects or errors that occur, an avoidance of defects is desirable.

In the effort to continue to reduce device sizes produced from lithography, photolithographic systems have been developed to use extreme ultraviolet light which has very short wavelengths that can allow very small image formation. Organometallic coatings have been shown to be useful as suitable photoresist materials for achieving high-resolution patterning and are very promising for commercial use for patterning extreme ultraviolet light as well as for e-beam patterning. To fully exploit organometallic resists, pragmatic improvements in processing for commercial environments can allow for the exploitation of the full potential for these materials.

SUMMARY OF THE INVENTION

In a first aspect, a multilayer structure is described which includes a substrate with a surface, an underlayer coating, over at least a portion of the substrate surface, and an organometallic resist layer over at least a portion of the underlayer coating, wherein the underlayer coating is a polymer composition with crosslinking moieties and adhesion-promoting moieties.

In a further aspect, a method of improving the adhesion between an underlayer coating and an organometallic resist layer is described. The method involves depositing an organometallic radiation sensitive coating onto a surface of a structure to cover at least a portion of the surface, in which the structure comprises a substrate and a stabilization coating on the substrate. Generally, at least a portion of the surface is formed by the stabilization coating, and the stabilization coating comprises a crosslinked polymer composition with adhesion-promoting moieties.

In another aspect, a method for forming a patterned coating material is described and comprises developing a multilayer coating to remove a portion of a patterned resist coating comprising metal atoms in which the conjugate portion of the patterned resist coating is located at least in part over a polymer undercoating having adhesion moieties providing desired adhesion interactions with the patterned resist coating.

BRIEF DESCRIPTION OF THE DRAWINGS

FIG. 1 is a side plan view of a patterned multilayer structure in which there is poor adhesion between the organometallic resist and the underlayer.

FIG. 2. is a side plan view of a patterned multilayer structure in which adhesion between the organometallic resist and the underlayer is too high.

DETAILED DESCRIPTION

Figure 4:
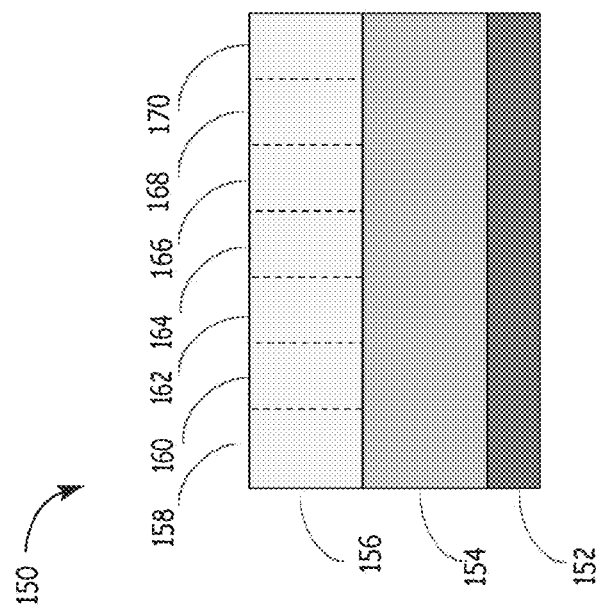
FIG. 4 is a side plan view of the radiation patterned multilayer structure with a latent image.

A multilayer structure is described in which a radiation-sensitive organometallic resist coating is stabilized by an underlayer coating ("underlayer"), which can provide more consistent processing in a commercial setting. In some embodiments, processing can be assisted with implementation of a method for controlling the adhesion between an underlayer and an organometallic resist coating according to a selected pattern. In particular, for negative tone patterning, the underlayer can be sensitive to radiation such that a selected enhanced adhesion pattern coincides with the selected radiation pattern. In alternative embodiments, such as positive tone patterning, the underlayer can be sensitive to radiation such that a selected reduced adhesion pattern coincides with the selected radiation pattern. Thus, methods herein provide for forming a patterned organometallic resist coating with improved quality through the use of a multilayer structure. The multilayer structure generally comprises a substrate layer, an underlayer, and an organometallic resist layer. The underlayer can comprises a polymer composition with functional groups capable of crosslinking and/or with stabilization-promoting functional groups, and other optional components, such as small-molecule photoacid generators. The underlayer stabilizes the organometallic resist coating, reducing the tendency for the organometallic resist coating to delaminate from the substrate and/or reducing the propagation of substrate surface imperfections. The underlayer also can provide for improved uniformity, reproducibility, and stability of the radiation-patterned organometallic coating features.

Conventional photoresists are composed of organic materials, especially polymers, and have found use in various applications, such as lithography. In as such, there has been a great deal of attention paid to advancing the effective and efficient use of these resists for commercial processes. Conventional photoresists have had difficulties in achieving very high resolution processing with extreme ultraviolet light.

In the course of developing organometallic photoresists ("resists") for various applications, it has been discovered that there is an unmet need for materials and processes that allow for the tailoring of the bulk and/or interfacial properties of organometallic resist coatings. The methods and structures described herein provide for various means to increase the surface and interfacial stability of resist layers for improved performance of radiation-sensitive organometallic resist coatings. As described herein, structures and processes are described to improve the stability of organometallic resist coatings.

While organometallic resists have proven to provide an ability to exploit more of the fine patterning capability of EUV photolithography, organometallic resists have been shown to display varying degrees of defectivity and fidelity depending on the surface onto which they are deposited. For example, it has been observed that deposition of organometallic resists onto highly polar surfaces, for example, surface compositions rich in —OH, can lead to higher levels of scumming. Conversely, it has been observed that deposition onto less polar surfaces, for example surface compositions with low levels of hydroxide groups, can lead to pattern collapse. Therefore, for appropriate embodiments, it can be desirable to provide an intermediate layer, or underlayer, between the organometallic resist and the surface that would allow for the selective control of the properties of the surface with which the resist is in contact. To be suitable for some embodiments, the underlayer can be coated as a highly uniform, thin layer, with a thickness on the order of several nm to several tens of nm.

The underlayer, as described herein, can reduce the occurrence of patterning defects, such as scumming, bridging, line wiggle, and line collapse, and thereby improve the quality of features and devices patterned with organometallic photoresists. Thus, in a commercial process setting, processing with the multilayer structures can provide improved reproducibility of process results and reduced product rejection due to process defects. In the buildup of a complex patterned structure with multiple patterned layers, different underlayer coatings can be provided for processing different layers of the structure, and for the processing of certain layers, an underlayer may not be used if it is expected to be unnecessary based on the substrate composition for a particular layer patterning. In some embodiments, underlayers may be used as a means to increase or decrease the resist etch rate for a given dose of radiation, to prevent stray reflections of radiation onto the resist, and also to tune the refractive index.

Organometallic-based radiation sensitive resists provide the ability to achieve the formation of very fine lines and dense patterns, especially using extreme ultraviolet light. In particular, alkyl tin oxide hydroxide compositions can be deployed with commercially acceptable processing approaches. The significant EUV absorption of these compositions along with the ability to achieve very high etch contrasts provides for the formation of very fine patterning. Also, these compositions can function as either negative resists or positive resists. The attractive properties of organometallic resists have been enhanced through the use of an underlayer that stabilizes the organometallic resist coating from the stage of initial deposition onto a surface through the stage of development and use of a lithographic pattern. In particular, the underlayer can be used as an intermediate adhesion layer to controllably adhere an organometallic resist coating to a substrate. The strength of the interaction may be controlled by the composition of the underlayer material and by the use of selected amounts and types of radiation. In this way, improved organometallic resist patterning can be accomplished that can reduce product rejection rate for failure to achieve performance according to specification. The ability to reduce waste due to failure of a product can provide significant value for commercial production.

The patterning to form small radiation based lithographic features involves projecting radiation, such as extreme ultraviolet radiation, through a mask based on the pattern onto a radiation sensitive material and development of the pattern using a developing solution. The quality of the resulting pattern is dependent on various factors. For the purposes of this disclosure, the first factor is the quality of the resist coating prior to patterning. For example, without adequate adhesion of the organometallic resist to the surface to which it is coated, there may be unintended delamination of the organometallic resist layer from the surface. A second factor that affects the quality of a pattern is the ability to fully remove the resist from certain areas while retaining the resist in other areas. For example, if the adhesion of the photoresist to the surface is too great, there may be unintended retention of resist on the surface. Thus, in either case, when the pattern is developed using a developing solution, corresponding adhesion-related imperfections may be present in the developed pattern.

Patterning of very small features has been accomplished with recently developed radiation-sensitive organometallic resist compositions. In particular, alkyl tin oxide hydroxide compositions provide desirable patterning performance, based at least in part on a high EUV absorption associated with the tin and a very high etch contrast upon radiation driven fragmentation of the alkyl—tin bond. The alkyl tin oxide hydroxide compositions provide an added feature of being able to function as either a negative resist, in which the radiation exposed regions remain after an initial development, or as a positive resist, in which the unexposed regions remain after an initial development. In any case, the development process is intended to involve processing conditions that do not significantly alter the remaining portions of the structure. For the alkyl tin oxide hydroxide compositions, the negative resist patterning can be performed with an organic solvent developing agent that dissolves the un-irradiated resist, and the positive resist patterning can be performed with an aqueous alkaline composition that dissolves the irradiated resist. This ability to perform under negative tone processing or positive tone processing is effectively exploited in the present combined processing to yield a more consistent and uniform pattern on a very small scale.

Organometallic radiation sensitive resists have been developed based on alkyl tin compositions, such as alkyltin oxide hydroxide, approximately represented by the formula $R_zSnO_{(2-z/2-x/2)}(OH)_x$, where $0<x<3$, $0<z\leq2$, $x+z\leq4$, and R is a hydrocarbyl group forming a carbon bond with the tin atom. Particularly effective forms of these compositions are monoalkytin oxide hydroxide, in which $z=1$ in the above formula. Alkyl tin based photoresist materials are further described in U.S. Pat. No. 9,310,684 to Meyers et al. (hereinafter the '684 patent), entitled "Organometallic Solution Based High Resolution Patterning Compositions," U.S. Pat. No. 10,642,153B1 to Meyers et al. (hereinafter the '153 patent), entitled "Organometallic Solution Based High Resolution Patterning Compositions and Corresponding Methods," and U.S. Pat. No. 10,228,618 B1 to Meyers et al.

(hereinafter the '618 patent), entitled "Organotin Oxide Hydroxide Patterning Compositions, Precursors, and Patterning," each of which are incorporated herein by reference. Organotin patterning compositions are described further below.

While alkyl tin compositions are demonstrating particularly promising results other organometallic resist compositions have been explored. See, for example, U.S. Pat. No. 9,176,377 to Stowers et al., entitled "Patterned Inorganic Layers, Radiation Based Patterning Compositions and Corresponding Methods," published U.S. patent application 2013/0224652 to Bass et al., entitled "Metal Peroxo Compounds with Organic Co-ligands for Electron Beam, Deep UV, and Extreme UV Photoresist Applications," and published U.S. patent application 2002/0076495 to Maloney et al., entitled "Method of Making Electronic Materials," all of which are incorporated herein by reference. Other organometallic patterning compositions based on various metals are described in published U.S. Pat. No. 9,372,402B2 to Freedman et al., entitled "Molecular Organometallic Resists for EUV," incorporated herein by reference. Resists with metal oxide particles having organic coatings are described in published U.S. patent application 2015/0234272A1 to Sarma et al., entitled "Metal Oxide Nanoparticles and Photoresist Compositions," incorporated herein by reference. In general, the underlayer materials described herein can be useful generally for organometallic resists.

The underlayer polymer composition can be selected to provide good adhesion to both the substrate and to the organometallic resist. To provide suitable inherent stability, the underlayer composition generally is crosslinked following deposition prior to organometallic resist deposition, and the crosslinking can be accomplished with heat and/or radiation with or without a catalyst and/or crosslinking agent. The underlayer composition generally has a functional group in a selected amount to provide adhesion properties, and some suitable functional groups are described below. Suitable polymers can be vinyl polymers or non-vinyl polymers. Furthermore, the underlayer polymer composition can be radiation sensitive to provide alteration of the binding when the resist is patterned with radiation, such as extreme ultraviolet light. For example, the polymer can comprise a photoacid generator to increase adhesion following exposure to radiation. Thus, for a negative tone resist, the resist changes composition upon exposure to radiation and the underlayer increases adhesion to the exposed resist so that the pattern is stabilized through two mechanisms: the initial adhesion and the radiation-enhanced adhesion. In positive tone patterning, exposure of the organometallic resist sufficiently changes the polarity of the exposed coating material, e.g., increasing the polarity, such that the exposed coating material can be selectively removed with an aqueous solvent or other highly polar solvent. In the case of a positive tone resist, the initial adhesion between the unexposed resist and the underlayer can be maintained after exposure. Thus the unexposed resist, which will form the pattern after selective removal of the exposed resist, can be stabilized by the presence of the underlayer.

Polymer underlayers are known in the photolithography art for use with conventional polymer photoresists. These underlayers can be used, for example, to improve planarization of the substrate surface prior to application of the resist composition. See, for example, published U.S. patent application 2017/0309493 to Ogihara et al. (hereinafter the '493 application), entitled "Method for Forming Organic Film and Method for Manufacturing Substrate for Semiconductor Apparatus," incorporated herein by reference. To improve fine patterning with EUV lithography with polymer resists, three layer structures have been attempted. The middle layer can incorporate silicon or metals. The '493 application teaches a silicon based middle layer. A three layer structure with other metals in the middle layer of a three layer resist structure is described in published U.S. patent application 2016/0187777 to Nakagawa et al., entitled "Composition and Pattern Forming Method," incorporated herein by reference. Polymer underlayers as described herein have compositions engineered to provide desired stabilization of organometallic resists, and in some embodiments, provide additional facilitation of the patterning process.

Photoacid generators have been used in photoresists to facilitate crosslinking upon irradiation to provide enhanced patterning function. As used herein, photoacid generators can be used in an underlayer to provide enhanced binding to an organometallic resist upon irradiation. In some embodiments, the underlayer is crosslinked prior to deposition of the resist with the photoacid generator remaining ready for activation during the patterning process.

FIG. 1 schematically depicts a developed patterned multilayer structure 100 in which the organometallic resist features 106, 108, 110 have delaminated from the underlayer 104, which is on the substrate 102. As usual for patent drawings, the figures are not to scale, and for these figures, the substrate would generally be significantly thicker than the coatings. Delamination may involve certain feature types and may be localized to certain regions of the multilayer. FIG. 2 shows a developed patterned organometallic multilayer structure 120 in which residual organometallic resist 132, 134, 136, 138 remains between the organometallic resist features 126, 128, 130. The multilayer structure includes an underlayer 124 and a substrate 122. It has been found that residual organometallic resist on the underlayer, a phenomenon commonly referred to as "scumming", is related to excessive adhesion between the organometallic resist coating and the underlayer. By providing a stabilizing underlayer as the surface upon which the organometallic resist is coated, the adhesion of the resist material to the surface can be tailored to the processing conditions and required pattern resolution, thereby enabling patterned organometallic coatings with improvements to the uniformity of average feature width, average line-width roughness, pitch, and quality, for example. With respect to quality, undesirable delamination and/or scumming can be reduced or eliminated. Quality and uniformity improvements can contribute to significant waste reduction by corresponding reductions in patterned wafers that fail quality control testing.

Figure 3:
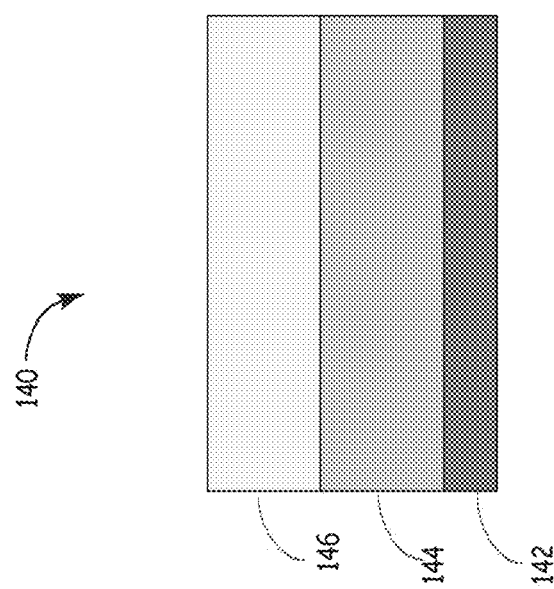
FIG. 3 is a side plan view of the multilayer structure.

FIG. 3 shows the underlayer 144 as part of a multilayer structure 140 used to generate a radiation-patterned organometallic resist. The multilayer structure, in this embodiment, includes a substrate 142, an underlayer 144 coated onto the substrate, and an organometallic resist 146 coated onto the underlayer. In one embodiment the multilayer structure 140 is baked and then exposed to patterned radiation. Referring to FIG. 4, a patterned multilayer structure 150 is shown comprising a substrate 152, an underlayer 154, and a patterned organometallic coating 156. The patterned organometallic coating 156 comprises regions 160, 164, 168 of irradiated organometallic coating material and regions 158, 162, 166, 170 of unirradiated organometallic coating material. The pattern formed by regions 160, 164, 168 and regions 158, 162, 166, 170 represents a latent image in the organometallic coating.

Figure 5:
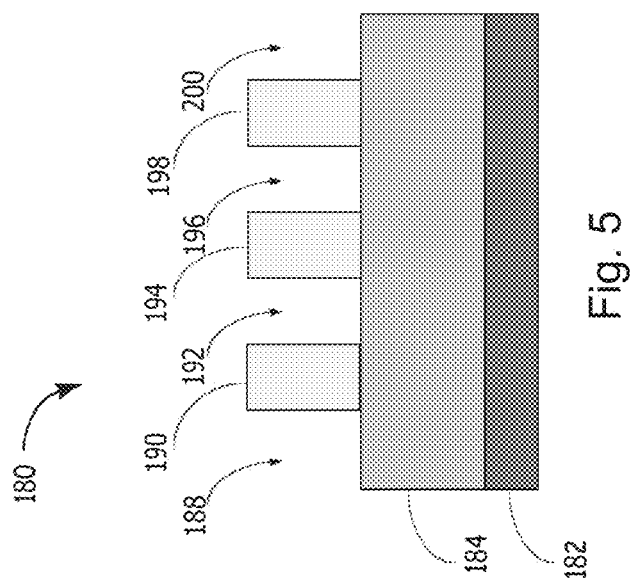
FIG. 5 is a side plan view of the structure of FIG. 4 after development of the latent image to remove unirradiated photoresist material to form a patterned structure.

With respect to negative tone imaging, referring to FIG. 5, the latent image of the multilayer structure shown in FIG.

4 has been developed, optionally after a post-irradiation heat treatment, through contact with a developer to form a developed patterned multilayer structure 180 which includes a substrate 182. After development of the image, organometallic resist features 190, 194, 198 exist at the positions of irradiated regions 160, 164, 168. The underlayer 184 may be partially exposed along the top surface through openings 188, 192, 196, 200. Openings 188, 192, 196, 200 are located at the positions of unirradiated regions 158, 162, 166, 170, respectively.

Figure 6:
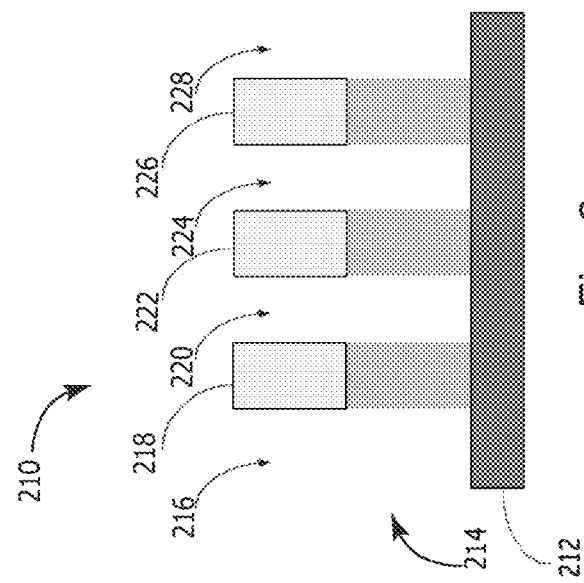
FIG. 6 is a side plan view of the structure of FIG. 5 in which the underlayer below unirradiated regions is removed to form a patterned structure.

In some embodiments, referring to FIG. 6, a developed patterned multilayer structure 210 may consist of a patterned underlayer 214, organometallic resist features 218, 222, 226, and a substrate 212 that is partially exposed along the top surface through openings 216, 220, 224, 228 below unirradiated regions 158, 162, 166, 170. In some embodiments, development of the organometallic coating 156 may be effective to also remove exposed portion of underlayer 154 of FIG. 4, such that the structure of FIG. 6 is formed with a single development step.

Figure 7:
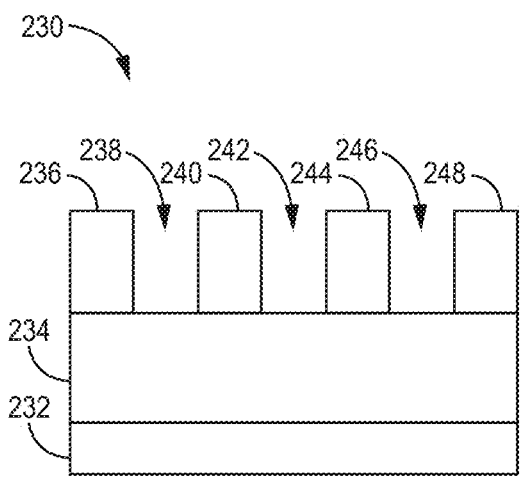
FIG. 7 is a side plan view of the structure of FIG. 4 after development of the latent image to remove irradiated coating material to form a patterned structure.

With respect to positive tone imaging, the latent image shown in FIG. 4 may be developed to form a patterned structure with the conjugate image of patterned structures 180 and/or 210. Referring to FIG. 7, the latent image of the multilayer structure shown in FIG. 4 has been developed, optionally after a post-irradiation heat treatment, through contact with a developer to form a developed a positive-tone patterned multilayer structure 230 which includes a substrate 232. After development of the image, organometallic resist features 236, 240, 244, 248 exist at the positions of unirradiated regions 158, 162, 166, 170. The underlayer 234 may be partially exposed along the top surface through openings 238, 242, 246. Openings 238, 242, 246 are located at the positions of irradiated regions 160, 164, 168, respectively.

Figure 8:
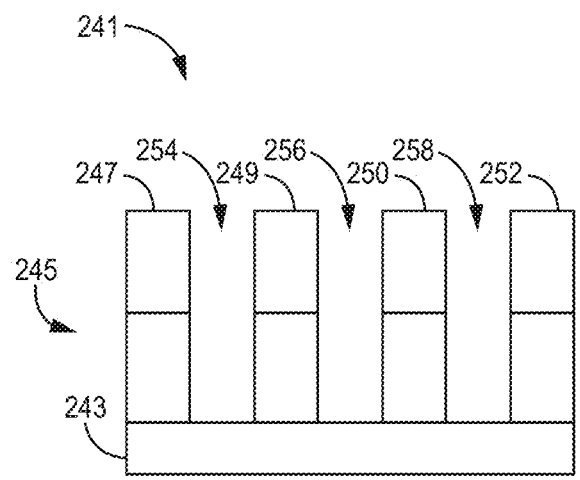
FIG. 8 is a side plan view of the structure of FIG. 7 in which the underlayer below unirradiated regions is removed to form a patterned structure.

In some embodiments, referring to FIG. 8, a developed patterned multilayer structure 241 may consist of a patterned underlayer 245, organometallic resist features 247, 249, 250, and 252, and a substrate 243 that is partially exposed along the top surface through openings 254, 256, and 258 below irradiated regions 160, 164, and 168. In some embodiments, development of the organometallic coating 156 may be effective to also remove exposed portions of underlayer 154 of FIG. 4, such that the structure of FIG. 8 is formed with a single development step.

In some embodiments, the underlayer material is a polymer composition that has functional groups capable of cross-linking and/or adhesion-promoting functional groups. The adhesion-promoting functional groups of the underlayer material may interact with the organometallic resist material via dipole-dipole forces, hydrogen bonding, ionic forces and/or the like.

One useful embodiment is based on stabilizing an organometallic resist coating prior to radiation patterning by forming the resist coating onto an underlayer comprised of a polymer material that has a plurality of cross-linking functional groups and a plurality of polar functional groups.

Figure 9:
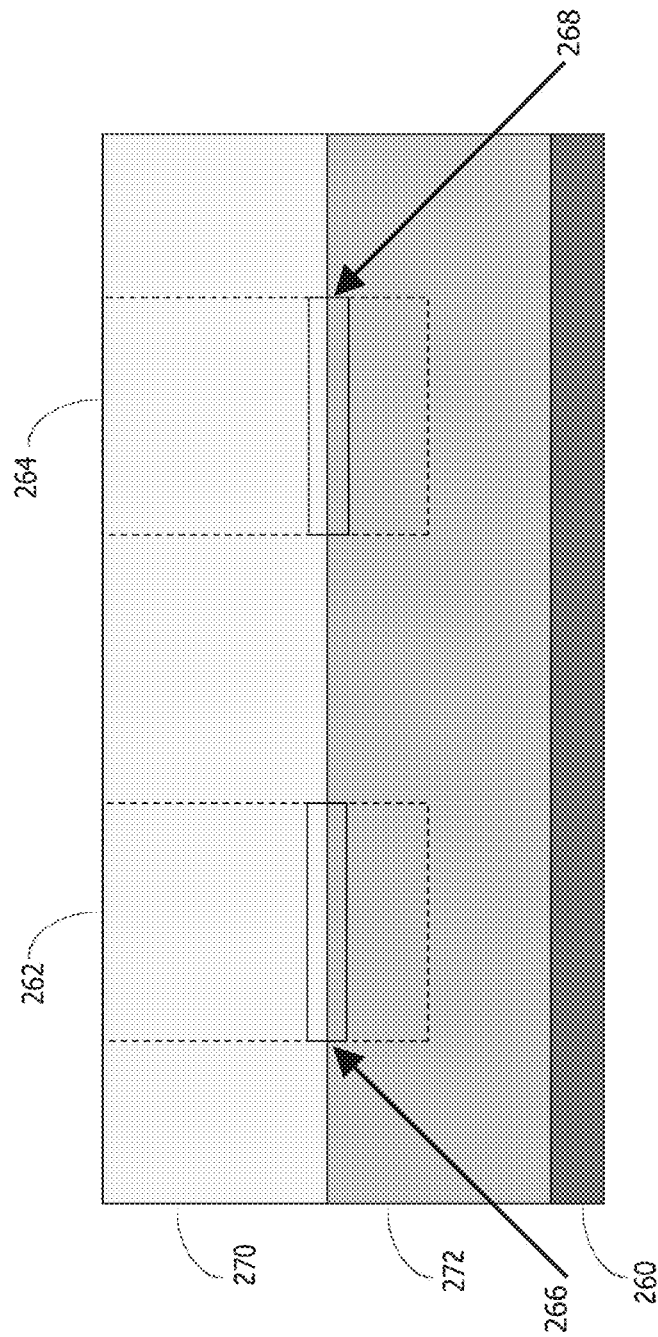
FIG. 9 is a side plan view of the multilayer structure depicting radiation-enhanced adhesion regions.

In some embodiments, as depicted in FIG. 9, the underlayer material is a polymer composition with adhesion-promoting functional groups that are activated by radiation. Irradiated regions 262 and 264 of the multilayer coating structure provide enhanced adhesion regions 266 and 268 between the patterned organometallic resist coating material 270 and the underlayer 272, which is on a substrate 260. In some embodiments, the irradiated regions 262 and 264 extend substantially through the underlayer, and for EUV irradiation organic polymers generally have low absorption so that radiation penetration through the layer is particularly likely. In some embodiments, the radiation-activated functional groups are photoacid generators (PAGs). In some embodiments the PAGs are activated in-situ, such as, but not limited to, during the radiation patterning of the organometallic resist.

Figure 10:
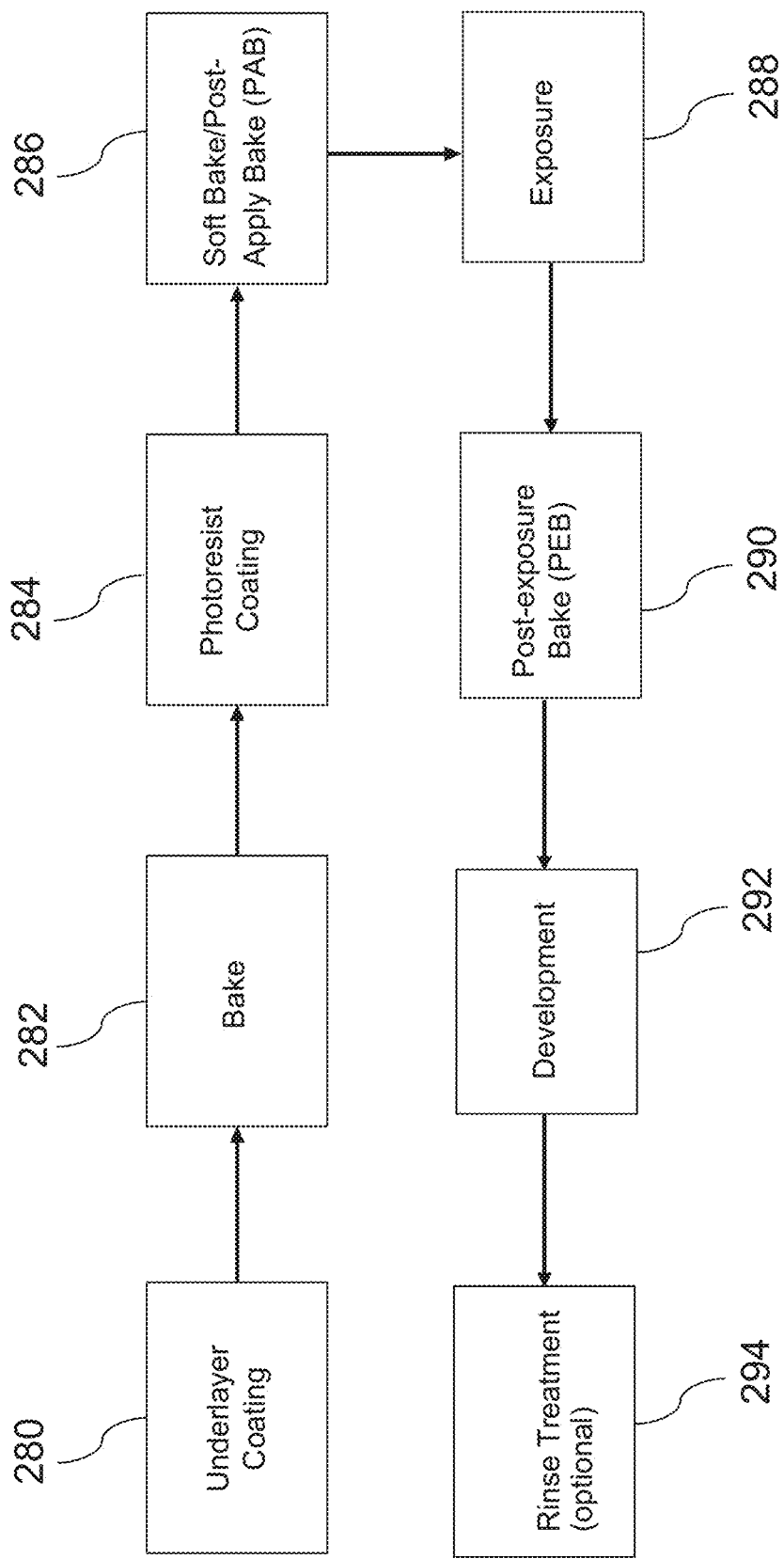
FIG. 10 is a flow chart for a photolithographic process according to embodiments of the present disclosure.

FIG. 10 is an outline of the method for controlling the adhesion between an underlayer and an organometallic resist: underlayer material is deposited or coated as a thin film on a substrate 280, bake 282, photoresist material is deposited or coated as a thin film onto the underlayer 284, pre-exposure bake or softbake 286, exposure to a pattern of radiation to create a latent image 288, post-exposure bake 290, and then development 292 with an appropriate solvent to produce a developed pattern of the resist. The process according to embodiments of the present disclosure can further include rinsing 294 the developed patterned multilayer structure to remove the residue from unexposed or underexposed organometallic resist between the patterned features.

The methods and structures described herein improve the process window of patterned organometallic resists by reducing defects, for example, pattern collapse and/or scumming.

Underlayers and Underlayer Compositions

Underlayers with appropriate properties and compositions can enhance the stability of patterned features and can reduce defects, such as scumming between features, line collapse, or delamination. When an appropriate underlayer is used, such as those described herein, adhesion between patterned features and the underlayer may be controlled. In some embodiments, the underlayer composition can comprise a crosslinked polymer with suitable functional groups to provide stabilizing interactions with an organometallic resist. In some embodiments, a negative tone resist is used and the adhesion between the underlayer and radiation-exposed areas of the organometallic resist is increased while the adhesion between the underlayer and unexposed areas of the organometallic resist remains low. A photoacid generator can be used to provide the enhanced post-exposure adhesion to the organometallic resist layer. During development and optional rinse treatment of negative tone resists, the low adhesion and high adhesion regions between the underlayer and the organometallic resist can be used advantageously to more completely remove unexposed photoresist and achieve patterns with more high-integrity features. In some embodiments, conventional photosensitive polymer compositions, such as useful for photosensitive resists, may be used in the underlayer compositions described herein.

The underlayers are generally formed through solution deposition process with subsequent processing. The underlayer precursor solutions are discussed in the next section along with corresponding processing. Once the underlayer solution is dried, it has initial properties. Then, the coating is generally crosslinked, unless crosslinking occurs during the initial drying process or due to the irradiation. The crosslinked underlayer has a second set of properties.

Generally, an underlayer film forming composition is used in a multilayer resist process that includes an underlayer and an organometallic resist. The underlayer composition can comprise a polymer composition comprising one or more crosslinking moieties and one or more adhesion-promoting moieties. In some embodiments, the underlayer composition can further comprise a thermal acid generator. Crosslinking moieties can serve to prevent dissolution/mixing of the underlayer and resist during coating and to improve mechanical properties of the substrate, especially soft substrates which are subject to instability of patterned lines. Crosslinking is generally implemented after formation of the undercoat and prior to deposition of the resist. In the following discussion of functional groups that can contribute to desirable polymer properties, the polymer backbone may be schematically shown as a vinyl polymer backbone or just schematically as a wavy line, and further discussions of polymer backbones are described further below.

In one embodiment, the crosslinking moiety (R2) may be covalently attached to a repeat units having structure of formula (1):

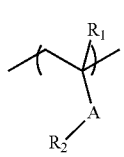

(1)

where $R_1$ is a hydrogen atom, a fluorine atom, a methyl group, or a $CF_3$ group, and A is a —$CO_2$—, —CO—, or —CONH— linkage, and $R_2$ is a hydroxide, an ether, a glycidyl, an epoxide, a methoxymethyl urea, or the like. When the underlayer film forming composition includes structural unit A, the level of crosslinking of the underlayer polymer can be increased.

Specific examples of polymer units with crosslinking moieties according to structure (1) are shown below:

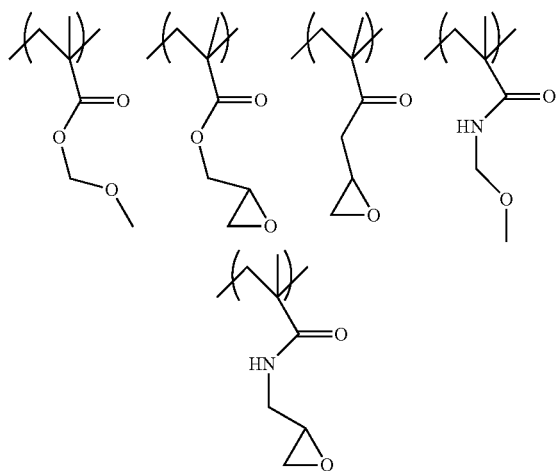

Other functional group-containing polymer compositions may be used. For example, U.S. Pat. No. 8,207,264 B2 entitled, "Functionalized Inclusion Complexes as Crosslinkers", incorporated herein by reference, describes cross-linked polymer compositions with suitable linking groups to attach the cross-linking functional groups to an inclusion complex or a polymer backbone such as polyethylene glycol. U.S. patent application 2006/0293482 A1, "Organo Functionalized Silane Monomers and Siloxane Polymers of the Same", incorporated herein by reference, describes an organosiloxane with pendant cross-linking groups. U.S. patent application 2009/0047517 A1, "Multilayer Polymer Films", describes cross-linking between polymer layers. The above references are herein incorporated by reference. U.S. patent application 2017/0088758 A1, "Polyurethane Adhesive Layers for Electro-optic Assemblies," incorporated herein by reference.

The polymer of the underlayer composition can further comprise one or more distinct monomeric units to improve adhesion between the organometallic resist and the underlayer. In some embodiments, adhesion-promoting moieties can comprise compositions that are polar and/or protic to provide covalent attachment to the organometallic resist. In some embodiments photoacid generators can aid in the formation of adhesion-promoting moieties, such that photoactivation can be used to increase the adhesion to the organometallic resists by formation of adhesion-promoting moieties. In alternative embodiments, photolabile groups can be used to provide higher affinity for the unexposed resist, which can be based on the composition of the underlayer. In some embodiments, photolysis of the organic underlayer from irradiation to the undercoat can decrease affinity for the irradiated organometallic patterning composition to facilitate removal of irradiated resist, such as may be desirable for positive tone patterning. The photolysis of the polymer underlayer can result in decreasing polarity and/or hydrogen bonding character.

In some embodiments, adhesion-promoting moieties can comprise monomeric units having structure (2):

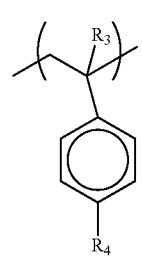

(2)

where $R_3$ is a hydrogen atom, a fluorine atom, a methyl group, or a $CF_3$ group, and $R_4$ provides a functional group capable of hydrogen bonding. Suitable functional groups capable of hydrogen bonding are an amine, an imine, an imide, an oxime, a carboxylic amide, a carboxylic acid, a thiol, a thiocarboxylic acid, a dithiocarboxylic acid, an alcohol, a sulfinic acid, a sulfonic acid, or a sulfonium salt. In some embodiments, polymers can comprise a plurality of such functional groups.

Specific examples of adhesion-promoting side chains according to structure (2) are shown below:

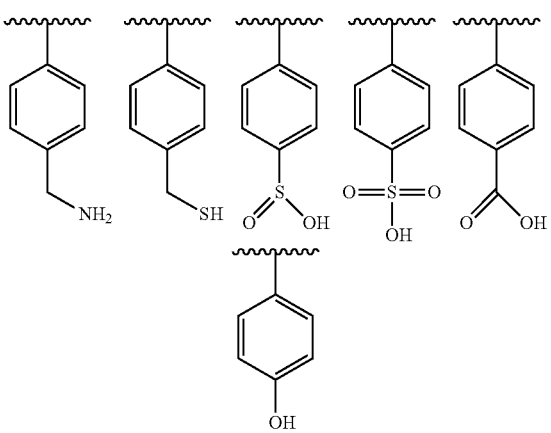

In further embodiments, adhesion-promoting moieties can comprise monomeric units having structure (3):

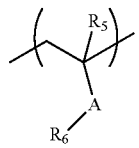
(3)

where $R_5$ is a hydrogen atom, a fluorine atom, a methyl group, or a $CF_3$ group, and A is a —$CO_2$—, —CO—, or —CONH— linkage, and $R_6$ provides a functional group capable of hydrogen bonding. Preferred functional groups capable of hydrogen bonding are an amine, an imine, an imide, an oxime, a carboxylic amide, a carboxylic acid, a thiol, a thiocarboxylic acid, a dithiocarboxylic acid, an alcohol, a sulfinic acid, a sulfonic acid, or a sulfonium salt. Specific examples of adhesion-promoting side chains according to structure (3) are shown below:

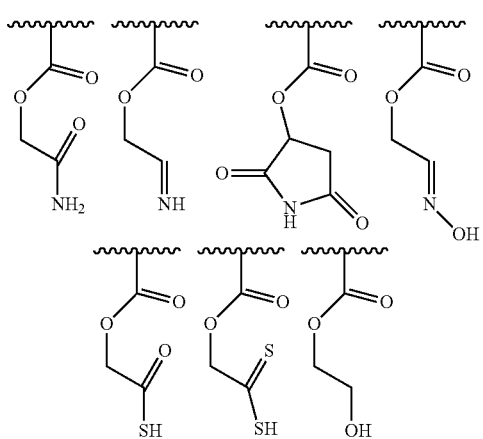

U.S. Pat. No. 9,527,971 B2, entitled "Functionalized Polymer Compositions and Films Formed from the Same", is directed to anhydride and/or carboxylic acid functionalized ethylene/alpha-olefin copolymers and is incorporated herein by reference.

In further embodiments, the underlayer polymer composition has repeat units with side-chain adhesion-promoting moieties and/or polymers with end-chain adhesion-promoting moieties. Non-limiting examples include functionalized styrenes, functionalized acrylates, functionalized vinyl ketones, functionalized acrylamides, functionalized urethane acrylates, functionalized phenolic resins, other functionalized vinyl or non-vinyl repeat units, or mixtures thereof. The adhesion-promoting moieties may be terminally functionalized with an amine, an imine, an imide, an oxime, a carboxylic amide, a carboxylic acid, a thiol, a thiocarboxylic acid, a dithiocarboxylic acid, an alcohol, a sulfinic acid, a sulfonic acid, a sulfonium salt, a photolabile moiety, such a sulfonium sulfonate, iodonium sulfonate, N-sulfonic imide, N-sulfonic imines, or the like and wherein the polymer composition has suitable film forming properties from solution.

Photoacid generators. In some embodiments the polymer underlayer material comprises photoacid generators (PAGs) and exposure to an appropriate radiation source will lead to generation of photoacids in the regions of irradiation. The PAG composition is not particularly limited, though particularly useful compositions are exemplified by sulfonium sulfonates, iodonium sulfonates, N-sulfonic imides, and N-sulfonic imines. PAGs may be covalently attached to the polymer or polymers in the underlayer and/or small molecule PAGs may be blended with the polymer or polymers in the underlayer. In some embodiments, specific particularly useful ionic PAGs are covalently bound to a polymer backbone and have a side chain structure (4):

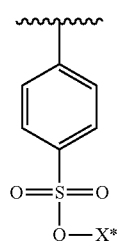
(4)

where X is triphenylsulfonium or bis(4-tert-butylphenyl) iodonium.

In some embodiments, a non-ionic PAG can be covalently bound to a polymer backbone and have a side chain structure (5):

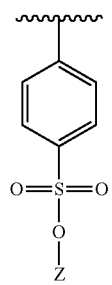
(5)

where Z is one of the following functional groups

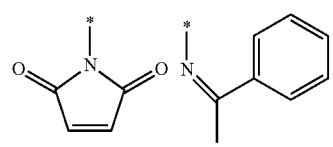
(6)

and * is a bond to the O atom of the sulfonate of the PAG. Suitable polymer backbone structures are not particularly limited, though particularly useful polymers or co-polymers can have polyethylene or polypropylene-based monomeric units with PAG sidechains, such as sidechain structures 4 and/or 5. See, for example, Wang et al., "Novel polymeric anionic photoacid generators (PAGS) and corresponding polymers for 193 nm lithography", J. Mater. Chem., 2006, 16, 3701-3707, incorporated herein by reference. Other PAG compositions are envisioned and are within the scope of the disclosure. Photoacids generated in the underlayer material can enhance adhesion in irradiated regions as discussed below.

Published Japanese patent application JP 2000/206680A, entitled "Photosensitive Resin Composition, Lithographic Printing Plate by Using Same and its Manufacture", incorporated herein by reference, describes the use of a novolak resin or a polyvinyl phenol resin in combination with a polyacid generator. Other ionic and non-ionic PAG moieties may be used, and U.S. Patent Application 2009/0258315A1, entitled "Photoacid Generator Compounds and Compositions" and U.S. Patent Application 2005/0279995A1, entitled "Composition for Preparing Organic Insulating Film and Organic Insulating Film Prepared from the Same" are herein incorporated by reference.

With respect to the polymer functional groups to improve adhesion with or without photoactivation, polymer blends and/or copolymers can be used to control the amounts of functional groups available for interactions. Thus, a polymer blend can comprise a plurality of polymers with differing functional groups, such as one polymer with no adhesion promoting functional groups, one or more polymers with adhesion promoting functional groups, one or more polymers with photoactivated adhesion promoting functional groups, one or more copolymers with adhesion promoting functional groups and crosslinking groups, or any combination of such polymers and functional groups. Generally, each component polymer is present in at least about one weight percent, in further embodiments at least about 5 weight percent, and in additional embodiments at least about 10 weight percent. The polymers generally can be selected to have appropriate chemical similarities so that the polymers form appropriate blends. A person of ordinary skill in the art will understand that additional ranges of polymer components within the explicit ranges above are conceived and are within the present disclosure.

Alternatively or additionally, copolymers can be used in which in which the copolymer comprises two or more different repeat units contributed by distinct monomers. The repeat units may have no adhesion promoting functional groups, adhesion promoting functional groups, photoactived adhesion promoting functional groups, crosslinking functional groups, or any combination thereof, where adhesion promoting functional groups and crosslinking functional groups can collectively be referred to as active functional groups. The copolymers can be random copolymers or block copolymers or combinations thereof. Generally, the copolymers would have at least about one percent of repeat units of a specified type, in further embodiments at least about 5 percent of repeat units of a specified type, and in other embodiments at least about 10 percent repeat units of a specified type. While all of the moieties of the polymer chain can have active functional groups, in some embodiments a polymer can have no more than 75 percent of the repeat moieties having an active functional group, in further embodiments no more than 65 percent and in other embodiments no more than 50 percent of the repeat moieties have active functional groups. The upper cutoff values and lower cutoff values on active functional groups can be combined appropriately to form ranges of active functional groups. Specific functional groups with adhesion enhancing characteristics or photoinduced adhesion promoting characteristics are described above. A person of ordinary skill in the art will recognize that additional ranges of relative amounts of polymer repeat units within the explicit ranges above are contemplated and are within the present disclosure.

Solvents

In general, any reasonable solvent can be used, although it is generally desirable for the underlayer film forming composition to exhibit suitable solubility and stability in the selected solvent. Examples of suitable solvents generally include, for example, ketones (e.g., acetone, methyl ethyl ketone, diethyl ketone, cyclopentanone, 2,4-pentanedione, diacetone alcohol, and the like), ethers (e.g., ethylene glycol monomethyl ether, ethylene glycol monophenyl ether, diethylene glycol monomethyl ether, propylene glycol monomethyl ether (PGME), and the like), esters (e.g., dimethyl carbonate, diethyl carbonate, ethyl acetate, propylene glycol monoethyl acetate (PGMEA), methyl acetoacetoate, and the like), alcohols (propanol, hexanol, 4-methyl-2-pentanol, cyclohexanol, iso-amyl alcohol, and the like), amides (acetamide, N,N-dimethylformamide, N-methylpyyrolidone, and the like), aromatic hydrocarbons (e.g., benzene, toluene, xylene, and the like), halogenated hydrocarbons (e.g., chloroform, dichloromethane, fluorocarbons, chlorobenzene, and the like) mixtures thereof, and the like. Solvents of particular interest include PGME, PGMEA, and ethyl lactate, although other solvents are envisioned and are within the scope of the disclosure.

The underlayer film forming composition can further comprise other additives, which are generally present each in amounts of no more than 10 weight percent and in further embodiments no more than about 5 weight percent. A person of ordinary skill in the art will recognize that additional ranges of additive amounts within the explicit ranges are contemplated and are within the present disclosure. Suitable additives can include, for example, viscosity modifiers, crosslinking catalysts, wetting agents, surfactants, other property modifiers, and combinations thereof.

Underlayer Film Forming

The underlayer film coating can generally be formed by conventional deposition methods such as spin coating, spray coating, slot coating, or the like. In a typical spin coating process, the underlayer film forming composition is deposited onto the surface of a substrate, such as a silicon wafer, whereupon the substrate is rotated such that rapid evaporation of solvent is induced to form a solid film on the substrate's surface. In some embodiments, a wafer can be spun at rates from about 500 rpm to about 10,000 rpm, in further embodiments from about 1000 rpm to about 7500 rpm and in additional embodiments from about 2000 rpm to about 6000 rpm. The spinning speed can be adjusted to obtain a desired coating thickness. The spin coating can be performed for times from about 5 seconds to about 5 minutes and in further embodiments from about 15 seconds to about 2 minutes. An initial low speed spin, e.g. at 50 rpm to 250 rpm, can be used to perform an initial bulk spreading of the composition across the substrate. A back-side rinse, edge bead removal step, or the like can be performed with water or other suitable solvent to remove any edge bead. A person of ordinary skill in the art will recognize that additional ranges of spin coating parameters within the explicit ranges above are contemplated and are within the present disclosure. A person of ordinary skill in the art can correspondingly adapt other coating processes for forming the underlayer based on the disclosure herein.

The thickness of the underlayer is generally a function of the polymer mass loading in underlayer film forming composition, the viscosity of the composition, and the spin speed used for spin coating. For coating processes other than spin coating, the thickness can generally also be adjusted through the selection of the coating parameters. In some embodiments, it can be desirable to use a thin coating to facilitate formation of small and highly resolved features in the subsequent patterning process. For example, the underlayer after drying can have an average thickness of no more than about 10 microns, in other embodiments, no more than about 1 micron, in further embodiments no more than about 250 nanometers (nm), in additional embodiments from about 1 nm to about 50 nm, in other embodiments from about 2 nm to about 40 nm and in some embodiments from about 3 nm to about 25 nm. In some embodiments, it can be useful to consider the ratio of the underlayer dry thickness to the organometallic layer dry thickness. For example, the ratio of underlayer dry thickness to radiation sensitive organometallic layer dry thickness can be from about 3:1 to 1:10 and in further embodiments from about 2:1 to about 1:7.5. A person of ordinary skill in the art will recognize that additional ranges of thicknesses and thickness ratios within the explicit ranges above are contemplated and are within the present disclosure. In general, the underlayer is relatively uniform to facilitate processing. In some embodiments, the variation in thickness of the coating varies by no more than ±50% from the average coating thickness, in further embodiments no more than ±40% and in additional embodiments no more than about 25% relative to the average coating thickness. In some embodiments, such as high uniformity coatings on larger substrates, the evaluation of coating uniformity may be evaluated with an edge exclusion region, such as a 1-centimeter edge exclusion, i.e., the coating uniformity is not evaluated for portions of the coating within 1-centimeter of the edge or other selected exclusion size. A person of ordinary skill in the art will recognize that additional ranges within the explicit ranges above are contemplated and are within the present disclosure.

Underlayer Bake. It is generally desirable to heat the underlayer-coated substrate to densify and, in some embodiments, crosslink the underlayer coating composition. In some embodiments, the underlayer can be heated to temperatures from about 45° C. to about 300° C. and in further embodiments from about 55° C. to about 250° C. The heating can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of heating temperature and times within the explicit ranges above are contemplated and are within the present disclosure. In additional or alternative embodiments, the underlayer can be crosslinked using heat, radiation, such as UV radiation, electrons arc or other suitable crosslinking mechanism. If the under layer is not fully crosslinked prior to deposition of the organometallic patterning composition, the patterning process can serve to crosslink or further crosslink the underlayer.

Substrates

A substrate generally presents a surface onto which the underlayer can be deposited, and the substrate may itself comprise a plurality of layers, which can be patterned in which the surface for supporting the underlayer relates to the exposed surface of an upper most layer. In some embodiments, the substrate surface can be treated to prepare the surface for adhesion of the underlayer. Also, the surface can be cleaned and/or smoothed as appropriate. Suitable substrate surfaces can comprise any reasonable material. Some substrates of particular interest include, for example, silicon wafers, silica substrates, other inorganic materials, polymer substrates, such as organic polymers, composites thereof and combinations thereof across a surface and/or in layers of the substrate. Wafers, such as relatively thin cylindrical structures, can be convenient, although any reasonable shaped structure can be used. Polymer substrates or substrates with polymer layers on non-polymer structures can be desirable for certain applications based on their low cost and flexibility, and suitable polymers can be selected based on the relatively low processing temperatures that can be used for the processing of the multilayer structures described herein. Suitable polymers can include, for example, polycarbonates, polyimides, polyesters, polyalkenes, copolymers thereof, and mixtures thereof.

Organometallic Resist. Following deposition and formation of the underlayer onto an appropriate substrate, a resist can subsequently be deposited onto the surface of the underlayer to form a multilayer structure. As described above, the underlayers described herein can be useful with a range of organometallic based patterning compositions. The following discussion focuses on organotin oxide hydroxides and related precursor compositions. Organometallic resists, such as those based on organotin oxide hydroxides, have been shown to possess excellent properties as resists for use in lithographic photopatterning. Organotin patterning materials are described further in the '684, '153 and '618 patents cited above.

Suitable organotin materials are generally based on the chemistry of radiation sensitive patterning compositions represented by the formula $R_zSnO_{(2-(z/2)-(x/2))}(OH)_x$ where $0<z\leq2$ and $0<(z+x)\leq4$, in which R is a hydrocarbyl group with 1-31 carbon atoms or blends thereof with distinct R groups, which can be written as $R_N$, for N distinct compositions. In a coating layer, the compositions can be integrated into a common oxo/hydroxo network. In particular, branched alkyl ligands can be desirable for some patterning compositions where the compound can be represented as $R^1R^2R^3CSn(NR')_3$, where $R^1$ and $R^2$ are independently an alkyl group with 1-10 carbon atoms, and $R^3$ is hydrogen or an alkyl group with 1-10 carbon atoms. As noted below, this representation of alkyl ligand R is similarly applicable to the other embodiments generally with $R^1R^2R^3CSn(X)_3$, with X corresponding to the trialkoxide or triamide moieties. In some embodiments $R^1$ and $R^2$ can form a cyclic alkyl moiety, and $R^3$ may also join the other groups in a cyclic moiety. Suitable branched alkyl ligands can be, for example, isopropyl ($R^1$ and $R^2$ are methyl and $R^3$ is hydrogen), tert-butyl ($R^1$, $R^2$ and $R^3$ are methyl), tert-amyl ($R^1$ and $R^2$ are methyl and $R^3$ is —CH$_2$CH$_3$), sec-butyl ($R^1$ is methyl, $R^2$ is —CH$_2$CH$_3$, and $R^3$ is hydrogen), neopentyl ($R^1$ and $R^2$ are hydrogen, and $R^3$ is —C(CH$_3$)$_3$), cyclohexyl, cyclopentyl, cyclobutyl, and cyclopropyl. Examples of suitable cyclic groups include, for example, 1-adamantyl (—C(CH$_2$)$_3$(CH)$_3$(CH$_2$)$_3$ or tricyclo(3.3.1.13,7) decane bonded to the metal at a tertiary carbon) and 2-adamantyl (—CH(CH)$_2$(CH$_2$)$_4$(CH)$_2$(CH$_2$) or tricyclo(3.3.1.13,7) decane bonded to the metal at a secondary carbon). In other embodiments hydrocarbyl groups may include aryl or alkenyl groups, for example, benzyl or allyl, or alkynyl groups. In other embodiments the hydrocarbyl ligand R may include any group consisting solely of C and H and containing 1-31 carbon atoms. In summary, some examples of suitable alkyl groups bonded to tin include, for example, linear or branched alkyl (i-Pr ((CH$_3$)$_2$CH—), t-Bu ((CH$_3$)$_3$C—), Me (CH$_3$—), n-Bu (CH$_3$CH$_2$CH$_2$CH$_2$—)), cyclo-alkyl (cyclo-propyl, cyclo-butyl, cyclo-pentyl), olefinic (alkenyl, aryl, allylic), or alkynyl groups, or combinations thereof. In further embodiments suitable R groups may include hydrocarbyl groups substituted with hetero-atom functional groups including cyano, thio, silyl, ether, keto, ester, or halogenated groups or combinations thereof.

Precursor compositions to the form organotin oxo/hydroxyl coating compositions that integrate into a common oxo/hydroxo network can comprise one or more soluble organotin oxo/hydroxo compounds, or corresponding compounds with hydrolyzable ligands that form oxo and/or hydroxo ligands upon hydrolysis. For precursor compositions with a plurality of compounds, the compounds can have distinct organic ligands with metal-carbon bonds and the same or distinct hyrolyzable ligands. Thus, precursor compositions to form the radiation sensitive coatings can comprise solutions of one or more compounds represented by $R_nSnX_{4-n}$ where n=1 or 2, in which R is a hydrocarbyl group with 1-31 carbon atoms, such as described above, and X is a ligand with a hydrolysable M—X bond, and mixtures thereof. Suitable hydrolysable ligands can include, for example, alkynides RC≡C, alkoxides RO⁻, carboxylates RCOO⁻, halides, dialkylamides or combinations thereof. In particular, organotin trialkoxide compositions can be represented by the formula $RSn(OR^O)_3$, where the $R^O$ group can be one of the same moieties described above for R. In some embodiments, the aforementioned organotin precursor compositions can further comprise compositions represented by $MX_4$ and/or $MO_{((m/2)-1/2)}(OH)_1$ where $0<z\leq 2$, $0<(z+w)\leq 4$, m=formal valence of $M^{m+}$, $0\leq 1\leq m$, and M=M' or Sn, where M' is a non-tin metal of groups 2-16 of the periodic table. In general, organotin photoresists exhibit both high resolution and high etch resistances that enable the formation of small features and patterns. Monoalkyl tin compositions, where n=1, have been found to be particularly effective for commercial patterning applications. In situ hydrolysis during the coating process or after a coating step can be used to hydrolyze the hydrolyzable M—X bonds to form an oxo/hydroxo network in the coating prior to patterning. The precursor compounds can also form clusters in solution with appropriate ligand rearrangement, in which at least some of the hydrolyzable ligands may be replaced with oxo bridges or hydroxyl groups, such as with three tin atoms, as described in published U.S. patent applications 2019/0153001 to Cardineau et al., entitled "Organotin Clusters, Solutions of organotin Clusters, and Application to High Resolution Patterning," and 2019/0308998 to Cardineau et al., entitled "Tin Dodecamers and Radiation Patternable Coatings With Strong EUV Absorption," both of which are incorporated herein by reference.

Formation of photosensitive organotin coatings can be achieved through various means known by those of ordinary skill in the art, such as spin coating. For solution deposition of precursors, for tin based resists described above, tin concentrations generally can be in the range of about 1 mM to about 1 M, in further embodiments from about 2 mM to about 750 mM, and in other embodiments from about 5 mM to about 500 mM by amount of tin. In some embodiments photosensitive organotin coatings can be formed via vapor deposition techniques, such as atomic layer deposition (ALD) or chemical vapor deposition (CVD) techniques, as described in Meyers et al. U.S. Pat. No. 10,228,618B2 entitled "Organotin Oxide Hydroxide Patterning Compositions, Precursors, and Patterning", and Smith et al. U.S. Pat. No. 9,996,004B2, entitled "EUV Photopatterning of Vapor-Deposited Metal Oxide-Containing Hardmasks", respectively, and both of which incorporated herein by reference.

The thickness of the coating generally can be a function of the precursor solution concentration, viscosity, and the spin speed. For other coating processes such as vapor deposition, the thickness can generally also be adjusted through the selection of the coating parameters. In some embodiments, it can be desirable to use a thin coating to facilitate formation of small and highly resolved features. In some embodiments, the coating materials can have an average dry thickness prior to development of no more than about 1 micron, in further embodiments no more than about 250 nanometers (nm), in additional embodiments from about 1 nanometers (nm) to about 50 nm, in other embodiments from about 1 nm to about 40 nm and in some embodiments from about 1 nm to about 25 nm. The ranges of post development coating thickness for the exposed regions generally fall within the same ranges as presented above with the realization that development may remove a relatively small amount of exposed material. A person of ordinary skill in the art will recognize that additional ranges of solution concentrations and thicknesses within the explicit ranges above are contemplated and are within the present disclosure. The thickness can be evaluated using non-contact methods of x-ray reflectivity and/or ellipsometry based on the optical properties of the film.

After deposition and formation of an organotin coating, an edge bead removal (EBR) rinse step generally is used. EBR processing typically occurs prior to any thermal processing or baking following deposition of the photoresist and involves rinsing the peripheral edge of a wafer or substrate with a solvent to remove the photoresist in selected regions. An EBR and backside rinse involves applying the edge bead rinse solution to the edge as well as the back of the wafer, as described in Waller et al. U.S. Pat. No. 10,627,719, entitled "Methods of Reducing Metal Residue in Edge Bead Region from Metal-Containing Resists", incorporated herein by reference.

Soft bake/Post-Application Bake. A soft bake, or a post-apply bake (PAB) is typically performed prior to radiation exposure to hydrolyze the hydrolysable bonds in the precursor compositions, and/or further drive off solvent, and promote densification of the coating material. In some embodiments, the PAB can be performed at temperatures from about 25° C. to about 250° C., in additional embodiments from about 50° C. to about 200° C. and in further embodiments from about 80° C. to about 150° C. The post application heating can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of PAB temperatures and times within the explicit ranges above are contemplated and are within the present disclosure. The coated material generally comprises a polymeric metal oxo-hydroxo network based on the binding oxo-hydroxo ligands to the metals in which the metals also have some alkyl ligands, or a molecular solid comprised of polynuclear metal oxo-hydroxo species with alkyl ligands.

Patterning of the Multilayer Coating

Patterning is generally achieved by exposing the resist to a desired aerial pattern of radiation. The radiation generally can be delivered according to a selected pattern. The radiation pattern is transferred to a corresponding pattern or latent image in the resist material with irradiated areas and un-irradiated areas. The irradiated areas comprise chemically altered resist material, and the un-irradiated areas generally comprise the as-formed resist material. For the tin-based organometallic resist materials discussed above, the absorption of radiation results in energy that can break the bonds between the metal and organic ligands so that at least some of the organic-based ligands are no longer available to stabilize the material. With the absorption of a sufficient amount of radiation, the exposed coating material condenses, i.e. forms an enhanced metal oxide-hydroxide network, which may involve water absorbed from the ambient atmosphere.

Radiation generally can be directed to the multilayer structure through a mask or a radiation beam that is controllably scanned across the multilayer structure. The resolution achievable for the radiation pattern is generally dependent on the radiation wavelength, and a higher resolution pattern generally can be achieved with shorter wavelength radiation. Thus, it can be desirable to use extreme ultraviolet (EUV), ultraviolet (UV), or charged particle (electron beams, ion beams, etc.) sources to achieve particularly high-resolution patterns. In embodiments which use negative tone pattern development, the underlayer remains under the regions in which the resist has been irradiated and may become part of the patterned multilayer structure. Underlayer material that is not under the irradiated resist regions, or equivalently, not according to the radiation pattern, may be removed during a development step and/or a rinse step. The rinse step is described in published U.S. Patent Application 2020/0124970 to Kocsis et al, entitled "Patterned Organometallic Photoresists and Methods of Patterning" and incorporated herein by reference.

The amount of electromagnetic radiation can be characterized by a fluence or dose which is obtained by the integrated radiative flux over the exposure time. In some embodiments, suitable radiation fluences can be from about 1 mJ/cm$^2$ to about 200 mJ/cm$^2$, in further embodiments from about 2 mJ/cm$^2$ to about 150 mJ/cm$^2$ and in further embodiments from about 3 mJ/cm$^2$ to about 100 mJ/cm$^2$. In an embodiment, the EUV radiation can be done at a dose of less than or equal to about 150 mJ/cm$^2$ or with an electron beam at a dose equivalent to or not exceeding about 2 mC/cm$^2$ at 30 kV. A person of ordinary skill in the art will recognize that additional ranges of radiation fluences within the explicit ranges above are contemplated and are within the present disclosure.

Electron beams can be characterized by the energy of the beam, and suitable energies can range from about 5 eV to about 200 keV and in further embodiments from about 7.5 eV to about 100 keV. Proximity-corrected beam doses at 30 keV can range from about 0.1 microcoulombs per centimeter squared ($\mu$C/cm$^2$) to about 5 millicoulombs per centimeter squared (mC/cm$^2$), in further embodiments from about 0.5 $\mu$C/cm$^2$ to about 1 mC/cm$^2$ and in other embodiments from about 1 $\mu$C/cm$^2$ to about 100 $\mu$C/cm$^2$. A person of ordinary skill in the art can compute corresponding doses at other beam energies based on the teachings herein and will recognize that additional ranges of electron beam properties within the explicit ranges above are contemplated and are within the present disclosure.

Negative-tone and Positive-tone Patterning. Following exposure of the multilayer structure to radiation, a post-irradiation heat treatment, i.e. post-exposure bake (PEB), is generally performed. The PEB step anneals the resist material to further condense irradiated regions without significantly condensing un-irradiated regions.

In embodiments in which negative-tone patterning is to be used, the underlayer material may include PAGs in order to enable photoacid-driven reactions to occur in regions of irradiation that will further increase the polarity and/or the hydrogen-bonding character of those underlayer regions, and therefore enhance the adhesion of the organometallic coating directly overlaying those underlayer regions. As discussed above, the irradiated organometallic resist material can be described as a metal oxide-hydroxide network and consequently has a higher bonding affinity to polar surfaces and/or surfaces having hydrogen-bonding character. It has been discovered that hydrogen bonding is particularly effective at increasing the affinity between regions of acid-catalyzed underlayer material and the irradiated regions of organometallic resist material. It is this high bonding affinity between the irradiated regions of the underlayer material and the irradiated resist material that can increase adhesion beyond that of the initial adhesion.

Suitable adhesion between the irradiated organometallic resist coating and the underlayer can decrease defects in subsequent processing such as delamination, line breaking, and line wiggling. During such processing, for example, development, organometallic resist material that is not sufficiently condensed can be washed away. However, if the adhesive force between the irradiated organometallic resist coating regions and the underlayer in contact with those regions is insufficient, then even irradiated resist material can partially or completely detach from the surface, leading to line wiggling or delamination. By controlled increase of the adhesion between the underlayer and the irradiated organometallic resist coating, for example by increasing the hydrogen bonding character of the underlayer material, such defects can be reduced.

Since unirradiated regions do not generate photoacids, those regions remain less adhesive and therefore do not increase the adhesion between the organometallic resist coating and the underlayer in the un-irradiated regions. The lower adhesion between the organometallic resist coating and the underlayer in unirradiated regions can improve defects in subsequent processing such as scumming and microbridging. While not intending to be limited by theory, these defect types are thought to occur due to the presence of partially hydrolyzed or condensed species in nominally unirradiated regions. These partially hydrolyzed or condensed species have a higher affinity towards surfaces and materials with higher polarity and/or having higher hydrogen-bonding character, and they can attach to or adsorb to these materials and surfaces and consequently remain after development leading, for example, to a pattern. In other embodiments where the underlayer composition comprises PAGs, high adhesion can promote attachment of irradiated organometallic resist coating, as discussed above, while simultaneously inhibiting the formation of scum and/or microbridging in unirradiated regions due to those regions having a lower potential for hydrogen bonding or by having a lower polarity.

Underlayers for positive-tone patterning may include a high concentration of adhesion-promoting moieties, including PAGs, in order to enhance the differential adhesion between the organometallic resist coating and the underlayer. Irradiation of the regions of the organometallic resist coating which are to be removed can initiate the photodegradation of the underlayer material in the underlying regions, such as by an acid-driven mechanism or by cleavage of the backbone of polymers in the underlayer composition or by other mechanisms. For positive-tone patterning, embodiments may include greater adhesion between the underlayer and the unirradiated organometallic resist coating and lower adhesion between the irradiated organometallic resist coating and the underlayer. Therefore, the positive-tone developed patterned organometallic resist coating may be effectively stabilized by the underlayer. In other embodiments, the underlayer below the irradiated areas may be effectively removed during the development step and/or during a separate rinse step. In other embodiments the underlayer composition may include polymers and other materials suitable for use as photoresists, PAGs that are covalently attached to the polymer or polymers in the underlayer, and/or small molecule PAGs. A person of ordinary skill in the art will recognize that other polymer compositions for the underlayer are contemplated and are within the present disclosure.

In other embodiments, the underlayer composition can have function groups that participate in hydrogen bonding or other polymer groups such that the organometallic resist coating is stabilized from delaminating from the multilayer structure prior to patterning of the resist. In some embodiments, the underlayer stabilizes the organometallic resist coating from abrasion or delamination from the multilayer structure and may or may not include PAGs. In embodiments in which the underlayer composition does not include PAGs, the underlayer can have a low concentration of adhesion-promoting moieties to inhibit the formation of defects such as scumming and microbridging.

Post-exposure Bake. The post-irradiation heat treatment can be performed at temperatures from about 45° C. to about 250° C., in additional embodiments from about 50° C. to about 190° C. and in further embodiments from about 60° C. to about 175° C. The post exposure heating can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of post-irradiation heating temperature and times within the explicit ranges above are contemplated and are within the present disclosure.

Development. After the post-irradiation heat treatment is performed, the organometallic resist coating is patterned with irradiated and unirradiated regions that form a latent image. Development of the image involves the contact of the patterned multilayer structure, which has a latent image, to a developer composition to remove either the unirradiated coating regions to form the negative image or the irradiated coating regions to form the positive image. The dual coatings, the underlayer and the organometallic coating, can be sequentially or simultaneously developed. If the underlayer is also radiation sensitive, the underlayer may also have a virtual image patterning. In some embodiments, where or not the underlayer has a pattern based on irradiation, it can be desirable for the development step to simultaneously remove the underlayer at the location of the removed resist material to expose the substrate. Using the organotin resist materials described above, effective negative-tone patterning or positive-tone patterning can be performed with desirable resolution using appropriate developing solutions or a single solution. If a single developer is not effective to simultaneously removed both coatings, the organometallic coating can be developed along the virtual image to expose regions of the underlayer, and the underlayer can be etches according to this pattern to expose the substrate.

In general, developer selection can be influenced by solubility parameters with respect to the underlayer and organometallic resist coating materials, both irradiated and non-irradiated, as well as developer volatility, flammability, toxicity, viscosity and potential chemical interactions with other process material. With respect to the organometallic resist, the irradiated regions are at least partially condensed to increase the metal oxide character so that the irradiated material is resistant to dissolving by organic solvents while the un-irradiated compositions remain soluble in the organic solvents. Thus organic solvents may be effectively used to develop a negative tone pattern. Conversely, a positive tone pattern may be effectively developed with a polar solvent, such as aqueous acids or bases, selected such that the irradiated composition is soluble the solvent and the un-irradiated composition remains insoluble in the solvent.

In particular, suitable developers for negative tone imaging include, for example, aromatic compounds (e.g., benzene, xylenes, toluene), esters (e.g., propylene glycol monomethyl ester acetate, ethyl acetate, ethyl lactate, n-butyl acetate, butyrolactone), alcohols (e.g., 4-methyl-2-propanol, 1-butanol, isopropanol, anisole), ketones (e.g., 2-heptanone, methyl ethyl ketone, acetone, cyclohexanone), ethers (e.g., tetrahydrofuran, dioxane) and the like. Suitable developers for positive tone imaging may include quaternary ammonium hydroxide compositions, such as tetraethylammonium hydroxide, tetrapropylammonium hydroxide, tetrabutylammonium hydroxide or combinations thereof. The development can be performed for about 5 seconds to about 30 minutes, in further embodiments from about 8 seconds to about 15 minutes and in addition embodiments from about 10 seconds to about 10 minutes. A person of ordinary skill in the art will recognize that additional ranges within the explicit ranges above are contemplated and are within the present disclosure.

Development or etching of the polymer undercoat can be performed with suitable processing conditions. In some embodiments, the organometallic resist coating and the underlayer are simultaneously developed with a common developer. For negative tone patterning, the composition removed during development is soluble in an organic solvent. Thus, the polymer underlayer in the un-irradiated locations, at least, should be soluble in organic solvents. If the polymer is not too heavily crosslinked during processing, an initially soluble coating composition can remain soluble in an organic solvent suitable for simultaneous development. For positive tone development, the irradiated organometallic patterning composition is removed with a basic solution. For example, if the crosslinked groups of the polymer are subject to hydrolysis in a basic solution, the polymer underlayer may be etched by the developed.

In one embodiment, an organometallic resist coating, suitable for negative tone development, can be formed over an underlayer that comprises a polymer composition that is a conventional positive tone resist or an analogous composition. For example, the conventional (organic) positive tone resist underlayer material may be a chemically amplified resist (CAR). The CAR may comprise a polymer with side-chain acid-photolabile groups, such as, but not limited to, repeat units having a monomeric structure of formula (7) where the vinyl groups can polymerize to form a corresponding vinyl polymer:

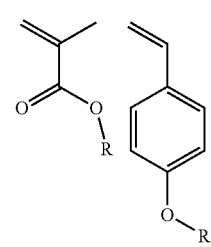

(7)

where R=—(CH$_2$)$_n$R' and n=0-10, and R' is, for example, CH$_3$, adamantyl, or t-butyl. In this example, upon exposure to radiation, the underlayer's exposed regions become more polar and more capable of hydrogen bonding, such as by cleavage of the O—R bond. The increased polarity increases adhesion between the exposed regions of the resist and the underlayer. Simultaneous development of an organometallic resist and a conventional positive tone resist underlayer with a suitable negative-tone developer, such as an organic solvent, can selectively remove the unirradiated regions of the organometallic resist and the conventional positive tone resist.

In some embodiments, conventional resist materials that would be suitable for use as an underlayer include polymers with side chains that are capable of cross-linking. Non-limiting examples of suitable polymer repeat units include those having a structure of formula (1). While the chemical properties of positive tone resists have characteristics desirable for underlayers described herein, the details of commercial photoresist compositions may not be designed for desired underlayer properties. Thus, the concentration, additives, solvents and other aspects can be adjusted to provide an underlayer composition to form a desired thickness and development properties.

In another embodiment, an organometallic resist coating, suitable for positive tone development, can be formed over a conventional positive tone resist underlayer. In this case, simultaneous development of the structure with a suitable positive-tone developer solvent, such as aqueous TMAH or other quaternary ammonium hydroxide, can selectively remove the irradiated regions of the organometallic resist and the conventional positive tone resist. One of ordinary skill in the art would understand that other aqueous and/or polar developer solvents may be used. In other embodiments, the organometallic resist coating and the underlayer may be sequentially developed. For example, the sequential development step may involve a solvent-based second development step with a solvent that is selective for the exposed underlayer. Alternatively or additionally, a dry etch can be performed, for example, with a plasma etch, as a second development step to selectively remove the underlayer that is exposed after the first development step, as shown in FIG. 7. A suitable plasma etch can be performed, for example, with an $O_2$ plasma.

In additional embodiments, following either simultaneous development or sequential development of the organometallic resist coating and the underlayer, a rinse step may be performed. Such a combination with a rinse step can improve the quality of the developed structure. The rinse can be performed with a common developer a solvent blend. Use of solvent blends for rinsing is described further above, and this discussion applies equally here.

Post-Development Heating. After completion of the development step, the patterned multilayer structure can be heat treated to further condense the material and to further dehydrate the material. This heat treatment can be particularly desirable for embodiments in which the oxide coating material is incorporated into the ultimate device, although it may be desirable to perform the heat treatment for some embodiments in which the organometallic coating material is used as a resist and ultimately removed if the stabilization of the coating material is desirable to facilitate further patterning. In particular, the bake of the patterned multilayer structure can be performed under conditions in which the patterned coating material exhibits desired levels of etch selectivity. In some embodiments, the patterned coating material can be heated to a temperature from about 100° C. to about 300° C., in further embodiments from about 175° C. to about 2750° C. and in additional embodiments from about 200° C. to about 250° C. The heating can be performed for at least about 1 minute, in other embodiment for about 2 minutes to about 1 hour, in further embodiments from about 2.5 minutes to about 25 minutes. The heating may be performed in air, vacuum, or an inert gas ambient, such as Ar or $N_2$. A person of ordinary skill in the art will recognize that additional ranges of temperatures and time for the heat treatment within the explicit ranges above are contemplated and are within the present disclosure.

For organotin pattering compositions, a post development rinse has been developed that can be used to remove patterning defects and improve patterning quality. This rinse process is described further in copending U.S. patent application Ser. No. 16/845,511 to Jiang et al., entitled "Organometallic Photoresist Developer Compositions and Processing Methods," incorporated herein by reference. Rinse compositions can comprise a blend of solvents that can be selected based on Hansen Solubility Parameters. Suitable rinse compositions can comprise a solvent blend with from about 0.25 volume percent to about 45 volume percent water, alcohol, glycol ether, pyrrolidone, lactone, carboxylic acid or a combination thereof, and at least 55 volume percent ketone, ether, ester, or combinations thereof.

After patterning, the patterned material can be used for further processing such as deposition of material into gaps in the patterned material, and/or etching to remove substrate material between gaps in the patterned material. Then, the patterned resist material can be removed following further processing with a suitable etchant composition, such as a dilute base or $BCl_3$ plasma. The processing is frequently repeated to form stacks of patterned layers to form functional components.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understood that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated.

What is claimed is:
1. A multilayer structure comprising:
a substrate with a surface, an underlayer coating over at least a portion of the substrate surface, and an organometallic resist coating comprising a radiation sensitive ligand bonded to a tin atom, over at least a portion of the underlayer coating, wherein the underlayer coating comprises a polymer composition comprising repeat units, wherein the repeat units comprise adhesion-promoting repeat units having adhesion-promoting side chains, wherein the repeat units are formed from monomers comprising functionalized styrenes, functionalized acrylates, functionalized vinyl ketones, functionalized acrylamides, functionalized urethane acrylates, functionalized phenolic resins, or from other functionalized vinyl monomers, or combinations thereof, wherein the adhesion-promoting side chains are terminally functionalized with an amine, an imine, an imide, an oxime, a carboxylic amide, a carboxylic acid, a thiol, a thiocarboxylic acid, a dithiocarboxylic acid, a sulfonium salt, a photolabile moiety, or combinations thereof, and wherein the underlayer coating has an average thickness from about 2 nm to about 40 nm.

2. The multilayer structure of claim 1 wherein the adhesion between the underlayer coating and the organometallic resist coating is sensitive to radiation.

3. The multilayer structure of claim 1 wherein the polymer composition further comprises crosslinking-promoting repeat units with side-chain crosslinking moieties and/or polymers with end-chain crosslinking moieties, wherein the crosslinking-promoting repeat units are formed from monomers comprising functionalized acrylates, functionalized vinyl ketones, functionalized acrylamides, or from other functionalized vinyl monomers, or mixtures thereof, wherein the side-chain crosslinking moieties may be terminally functionalized with a hydroxide, an ether, a glycidyl, an epoxide, a methoxymethyl urea, an acrylate, or combinations thereof, and wherein the polymer composition has suitable film forming properties from solution.

4. The multilayer structure of claim 3 wherein the crosslinking-promoting repeat units have a structure of formula (1):

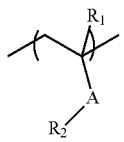

wherein $R_1$ is a hydrogen atom, a fluorine atom, a methyl group, or a $CF_3$ group, and A is a —$CO_2$—, —CO—, or —CONH— linkage, and $R_2$ is an ether, a glycidyl, an epoxide, a methoxymethyl urea, an acrylate, or combinations thereof, or wherein the adhesion-promoting repeat units have a structure of formula (2):

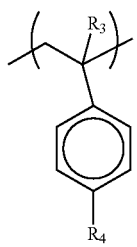

wherein $R_3$ is a hydrogen atom, a fluorine atom, a methyl group, or a $CF_3$ group and $R_4$ comprises an alkyl linkage to an adhesion-promoting moiety capable of hydrogen bonding, or wherein the adhesion-promoting repeat units have a structure of formula (3):

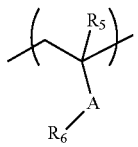

wherein $R_5$ is a hydrogen atom, a fluorine atom, a methyl group, or a $CF_3$ group, A is a —$CO_2$—, —CO—, or —CONH— linkage, and $R_6$ comprises an alkyl linkage to an adhesion-promoting moiety capable of hydrogen bonding.

5. The multilayer structure of claim 3 wherein the repeat units comprise from 5% to 65% of the crosslinking-promoting repeat units.

6. The multilayer structure of claim 1 wherein the polymer composition is crosslinked, and wherein the thickness of the underlayer coating varies less than about 25% from the average thickness of the underlayer coating.

7. The multilayer structure of claim 1 wherein the polymer composition optionally comprises end-chain adhesion-promoting moieties, wherein the polymer composition has suitable film forming properties from solution.

8. The multilayer structure of claim 1 wherein the adhesion-promoting side chains are capable of hydrogen bonding and comprise an amine, an imine, an imide, an oxime, a carboxylic amide, a carboxylic acid, a thiol, a thiocarboxylic acid, a dithiocarboxylic acid, or a sulfonium salt.

9. The multilayer structure of claim 1 wherein the adhesion-promoting repeat units comprise photolabile moieties represented by a structure of formula (4):

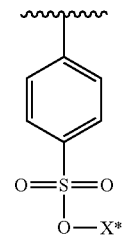

wherein X is triphenylsulfonium or bis(4-tert-butylphenyl)iodonium.

10. The multilayer structure of claim 1 wherein the adhesion-promoting repeat units comprise photolabile moieties represented by a structure of formula (5):

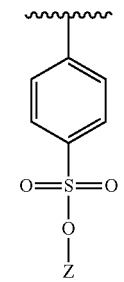

wherein Z is selected from structures of formula (6):

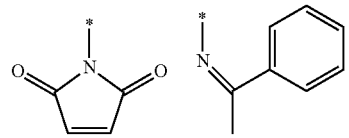

wherein * is a bond to the O atom of the sulfonate of the PAG.

11. The multilayer structure of claim 1 wherein the substrate comprises a silicon wafer, silica substrate, other inorganic material, a polymer sheet, and combinations thereof.

12. The multilayer structure of claim 1 wherein the radiation sensitive ligand comprises an alkyl ligand.

13. The multilayer structure of claim 12 wherein irradiation with extreme ultraviolet light changes solubilities of the organometallic resist coating material and/or the underlayer coating material relative to un-irradiated coating material.

14. The multilayer structure of claim 12 wherein irradiation with extreme ultraviolet light changes adhesion interactions between the underlayer and the organometallic resist coating.

15. The multilayer structure of claim 1 wherein the organometallic resist coating comprises an alkyltin oxide hydroxide, approximately represented by the formula $R_zSnO_{(2-z/2-x/2)}(OH)_x$, where $0<x<3$, $0<z\le2$, $x+z\le4$, and R is a hydrocarbyl group forming a carbon bond with the tin atom.

16. The multilayer structure of claim 1 wherein the organometallic resist coating has an average thickness from 1 nm to 50 nm.

17. The multilayer structure of claim 1 wherein the organometallic resist coating is patterned and wherein a first portion of the coating has fewer alkyl ligands bonded to metal than a second portion of the coating due to radiation cleavage of alkyl ligand-metal bonds.

18. The multilayer structure of claim 1 wherein the underlayer coating is soluble in at least some organic solvents.

19. The multilayer structure of claim 1 wherein the underlayer coating has an average thickness from about 10 nm to about 40 nm, and wherein the thickness of the underlayer coating varies less than about 25% from the average thickness of the underlayer coating.

20. The multilayer structure of claim 1 wherein a ratio of the average thickness of the underlayer to an average thickness of the organometallic resist coating is from about 3:1 to about 1:2.

21. The multilayer structure of claim 1 wherein the substrate comprises a silicon wafer and wherein the underlayer coating is disposed directly on the substrate.

22. The multilayer structure of claim 1 wherein the adhesion-promoting repeat units may be terminally functionalized with a photolabile moiety comprising sulfonium sulfonate, iodonium sulfonate, N-sulfonic imide, N-sulfonic imines, or combinations thereof.

23. The multilayer structure of claim 1 wherein the polymer composition further comprises crosslinking moieties.

* * * * *